United States Patent
Aizawa et al.

(10) Patent No.: US 10,607,785 B2
(45) Date of Patent: Mar. 31, 2020

(54) ELECTRONIC COMPONENT AND ELECTRONIC DEVICE

(71) Applicant: Seiko Epson Corporation, Shinjuku-ku (JP)

(72) Inventors: Tadashi Aizawa, Matsumoto (JP); Seiji Osawa, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 349 days.

(21) Appl. No.: 15/418,008

(22) Filed: Jan. 27, 2017

(65) Prior Publication Data

US 2017/0221636 A1    Aug. 3, 2017

(30) Foreign Application Priority Data

Jan. 29, 2016    (JP) .................. 2016-015751

(51) Int. Cl.
| | | |
|---|---|---|
| *H01G 4/40* | (2006.01) | |
| *G01S 19/19* | (2010.01) | |
| *G01S 19/14* | (2010.01) | |
| *G01S 19/13* | (2010.01) | |
| *H01F 27/40* | (2006.01) | |
| *H01Q 1/27* | (2006.01) | |
| *H01Q 9/04* | (2006.01) | |
| *H03H 1/00* | (2006.01) | |
| *H01F 5/00* | (2006.01) | |

(52) U.S. Cl.
CPC ............... *H01G 4/40* (2013.01); *G01S 19/13* (2013.01); *G01S 19/14* (2013.01); *G01S 19/19* (2013.01); *H01F 27/40* (2013.01); *H01Q 1/273* (2013.01); *H01Q 9/0407* (2013.01); *H03H 1/00* (2013.01); *H01F 5/003* (2013.01); *H03H 2001/0021* (2013.01)

(58) Field of Classification Search
USPC ......................................................... 361/270
See application file for complete search history.

(56) References Cited

U.S. PATENT DOCUMENTS

| | | | |
|---|---|---|---|
| 6,633,748 B1 * | 10/2003 | Watanabe ................ | H03H 7/46 333/101 |
| 6,958,732 B2 | 10/2005 | Yuanzhu | |
| 6,982,673 B2 | 1/2006 | Yuanzhu | |
| 8,077,092 B2 | 12/2011 | Coupez et al. | |
| 8,711,039 B2 | 4/2014 | Horisawa et al. | |

(Continued)

FOREIGN PATENT DOCUMENTS

| | | |
|---|---|---|
| JP | H03-206737 A | 9/1991 |
| JP | 07-297626 A | 11/1995 |

(Continued)

*Primary Examiner* — Danny Nguyen
(74) *Attorney, Agent, or Firm* — Kilpatrick Townsend & Stockton LLP

(57) ABSTRACT

An electronic component includes an antenna electrode functioning as a first electrode plate, a circuit board functioning as a second electrode plate, and a short-circuit section that electrically connects the antenna electrode and the circuit board. The circuit board includes a surface functioning as a first surface opposed to the antenna electrode, a grounding section, a circuit component functioning as a conductive structure disposed on the surface, and a wiring pattern that connects the circuit component and the grounding section.

16 Claims, 13 Drawing Sheets

(56) References Cited

U.S. PATENT DOCUMENTS

| | | | |
|---|---|---|---|
| 2004/0119654 A1* | 6/2004 | Koyama | H01Q 1/243 |
| | | | 343/846 |
| 2005/0122268 A1 | 6/2005 | Suzuki | |
| 2007/0205945 A1 | 9/2007 | Tatarnikov et al. | |
| 2008/0074327 A1* | 3/2008 | Noro | H01Q 9/0421 |
| | | | 343/700 MS |
| 2010/0103058 A1* | 4/2010 | Kato | G06K 19/07749 |
| | | | 343/702 |
| 2012/0213039 A1 | 8/2012 | Aizawa et al. | |

FOREIGN PATENT DOCUMENTS

| | | |
|---|---|---|
| JP | 07-297627 A | 11/1995 |
| JP | 2004-312166 A | 11/2004 |
| JP | 2004-343285 A | 12/2004 |
| JP | 2005-005866 A | 1/2005 |
| JP | 2005-167900 A | 6/2005 |
| JP | 2007-535851 A | 12/2007 |
| JP | 4818734 B2 | 11/2011 |
| JP | 2012-147263 A | 8/2012 |
| JP | 2012-189570 A | 10/2012 |
| JP | 2012-248982 A | 12/2012 |
| JP | 2013-061308 A | 4/2013 |

* cited by examiner

ELECTRONIC COMPONENT AND ELECTRONIC DEVICE

CROSS-REFERENCE TO RELATED APPLICATIONS

The entire disclosure of Japanese Patent Application No. 2016-015751, filed Jan. 29, 2016 is expressly incorporated by reference herein.

BACKGROUND

1. Technical Field

The present invention relates to an electronic component and an electronic device.

2. Related Art

When a GPS (Global Positioning System) receiver is incorporated in a small housing of a wristwatch or the like, it is necessary to reduce the volume of an antenna used in the receiver as much as possible and form the antenna in a shape optimum for incorporating the receiver in the clock. Therefore, in the past, studs are arrayed on a grounding plane of a plane antenna and/or one or more radiating elements (patches) to reduce a wavelength to obtain the plane antenna compact in size (e.g., JP-T-2007-535851 (Patent Literature 1)).

However, in Patent Literature 1, a reduction amount of the wavelength is limited.

SUMMARY

An advantage of some aspects of the invention is to provide an electronic component and an electronic device capable of greatly reducing a wavelength.

The invention can be implemented as the following aspects or application examples.

APPLICATION EXAMPLE 1

An electronic component according to this application example includes: a first electrode plate; a second electrode plate including a first surface opposed to the first electrode plate, a grounding section, a conductive structure disposed on the first surface, and a wire configured to connect the structure and the grounding section; and a connecting section configured to electrically connect the first electrode plate and the second electrode plate.

This application example is, for example, an example in which the invention is applied to a planar inverted F antenna. According to this application example, parasitic capacitance C1 is present between the first electrode plate and the second electrode plate. Parasitic capacitance C2 is present between the conductive structure disposed on the first surface of the second electrode plate and the first electrode plate. Since the interval between the structure and the first electrode plate is shorter than the interval between the first electrode plate and the second electrode plate, capacitance per unit area is larger in the parasitic capacitance C2 than the parasitic capacitance C1. As a result, a large electric current flows to the parasitic capacitance C2. However, in order to supplement the electric current, a large electric current flows to the wire that connects the structure and the grounding section. Therefore, compared with when the wire is absent, a current path on the second electrode plate is long. It is possible to obtain a wavelength reducing effect without using a dielectric.

APPLICATION EXAMPLE 2

An electronic component according to this application example includes: a first electrode plate; a second electrode plate; and a power feeding portion provided on the second electrode plate. The second electrode plate includes: a first surface opposed to the first electrode plate; a grounding section; a conductive structure disposed on the first surface; and a wire configured to connect the structure and the grounding section.

This application example is, for example, an example in which the invention is applied to a patch antenna. According to this application example, parasitic capacitance C1 is present between the first electrode plate and the second electrode plate. Parasitic capacitance C2 is present between the conductive structure disposed on the first surface of the second electrode plate and the first electrode plate. Since the interval between the structure and the first electrode plate is shorter than the interval between the first electrode plate and the second electrode plate, capacitance per unit area is larger in the parasitic capacitance C2 than the parasitic capacitance C1. As a result, a large electric current flows to the parasitic capacitance C2. However, in order to supplement the electric current, a large electric current flows to the wire that connects the structure and the grounding section. Therefore, compared with when the wire is absent, a current path on the second electrode plate is long. It is possible to obtain a wavelength reducing effect without using a dielectric.

APPLICATION EXAMPLE 3

In the electronic component according to the application example, the second electrode plate may be a circuit board.

According to this application example, since the circuit board is used as the second electrode plate as well, the number of components is reduced. This application example contributes to a reduction in the size of the electronic component.

APPLICATION EXAMPLE 4

In the electronic component according to the application example, the circuit board may be a board on which an electric conductor and an insulator are stacked.

According to this application example, since the circuit board is the board on which the electric conductor and the insulator are stacked, it is easy to adjust, for example, the length of the wire as appropriate.

APPLICATION EXAMPLE 5

In the electronic component according to the application example, the structure may be a circuit component.

According to this application example, since the structure is the circuit component, it is possible to change the number of structures as appropriate. As a result, it is possible to change the number of wires connected to the structures as well. It is easy to adjust the magnitude of the wavelength reducing effect.

APPLICATION EXAMPLE 6

In the electronic component according to the application example, the circuit component may be an integrated circuit, a stud, a conductor block, or a shield case.

According to this application example, since the circuit component is the integrated circuit, the stud, the conductor block, or the shield case, it is possible to change the number of circuit components as appropriate. As a result, it is possible to change the number of wires connected to the structures as well. It is easy to adjust the magnitude of the wavelength reducing effect.

APPLICATION EXAMPLE 7

In the electronic component according to the application example, the connecting section may short-circuit the first electrode plate and the second electrode plate.

According to this application example, since the connecting section short-circuits the first electrode plate and the second electrode plate, for example, it is possible to cause the electronic component to act as a planar inverted F antenna.

APPLICATION EXAMPLE 8

In the electronic component according to the application example, a capacitor having capacitance C may be connected to the wire to satisfy a relation of an antenna resonant frequency=½π(LC)$^{1/2}$ with respect to inductance L of the wire.

According to this application example, since the capacitor having the capacitance C satisfying the relation of the antenna resonant frequency=½π(LC)$^{1/2}$ is connected the wire having the inductance L, it is possible to obtain a desired antenna resonant frequency.

APPLICATION EXAMPLE 9

In the electronic component according to the application example, width of the wire that connects the structure and the grounding section directly or via a capacitor may be set to be larger than width of other wires connected to components other than the structure of the capacitor.

According to this application example, the width of the wire that directly connects the structure and the grounding section or the wire that connects the structure and the grounding section via the capacitor is set larger than the width of the other wires connected to the components other than the structure or the capacitor. Consequently, since the inductance of the wire decreases and parasitic resistance is reduced, the wavelength reducing effect is reduced and radiation effect is improved.

APPLICATION EXAMPLE 10

An electronic device according to this application example includes the electronic component described above.

According to this application example, it is possible to provide the electronic device that can obtain a desired resonant frequency without using a dielectric block even if the electronic device is small in size.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
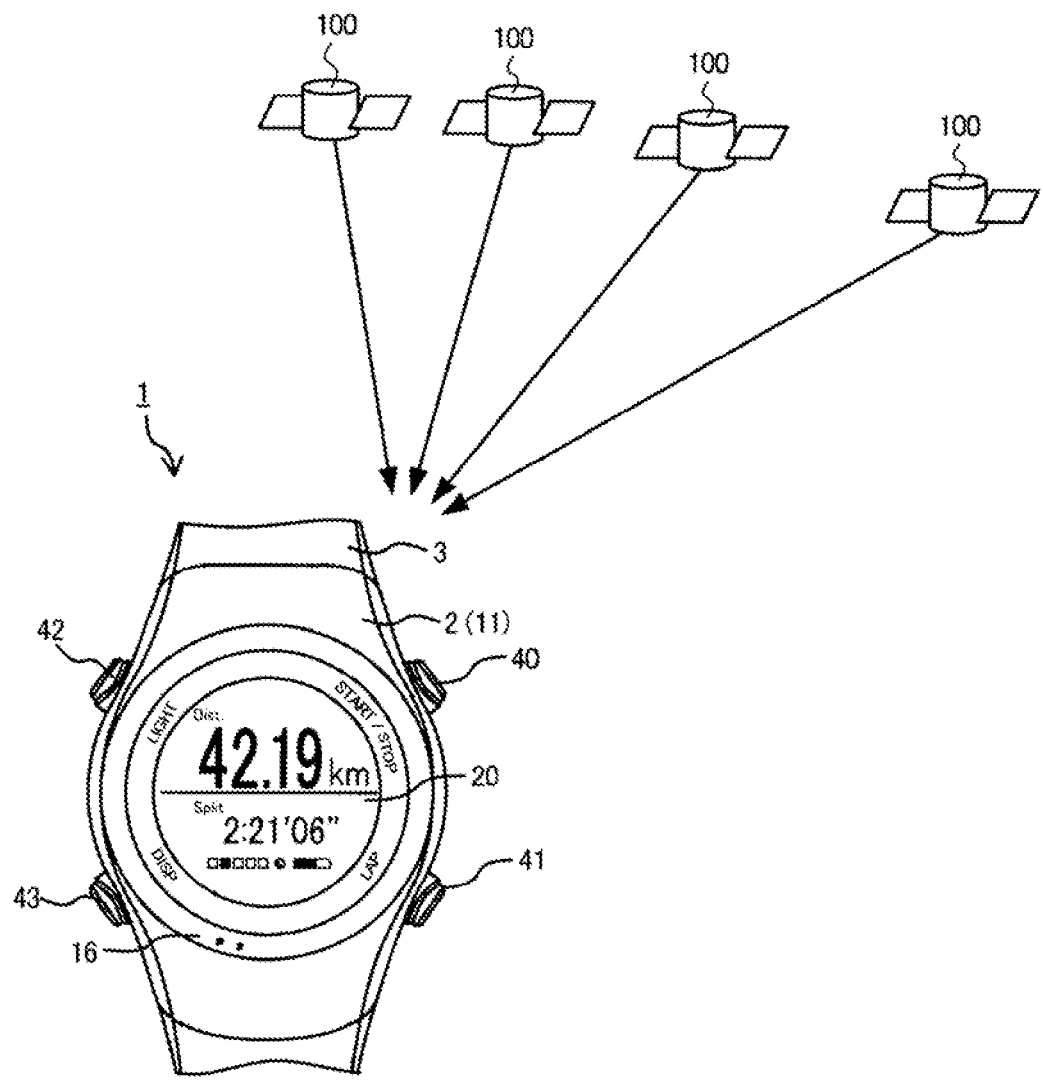
FIG. 1 is an overall diagram showing an example of a GPS system including an antenna-incorporated running watch serving as an example of an electronic device according to a first embodiment of the invention.

Preferred embodiments of the invention are explained below with reference to the accompanying drawings. In the drawings, dimensions and scales of sections are different from actual dimensions and scales as appropriate. The embodiments explained below are preferred specific examples of the invention. Therefore, technically preferred various limitations are added to the embodiments. However, the scope of the invention is not limited to these embodiments unless specifically mentioned in the following explanation that the invention is limited.

First Embodiment

A: Mechanical Configuration of an Antenna-Incorporated Electronic Device

FIG. 1 is an overall diagram schematically showing an example of a GPS system including an electronic device according to a first embodiment of the invention. As shown in FIG. 1, an electronic device 1 in this embodiment is an arm-wearing running watch worn on a wrist or an arm of a user. The running watch incorporates a GPS function capable of receiving, with a GPS receiver, satellite signals (GPS signals) transmitted from several GPS satellites 100 present in the sky and calculating a present position. The electronic device 1 can measure, for example, a distance, speed, and a route of running according to position information and time information calculated using the GPS signals and can support exercise of the user.

Figure 2:
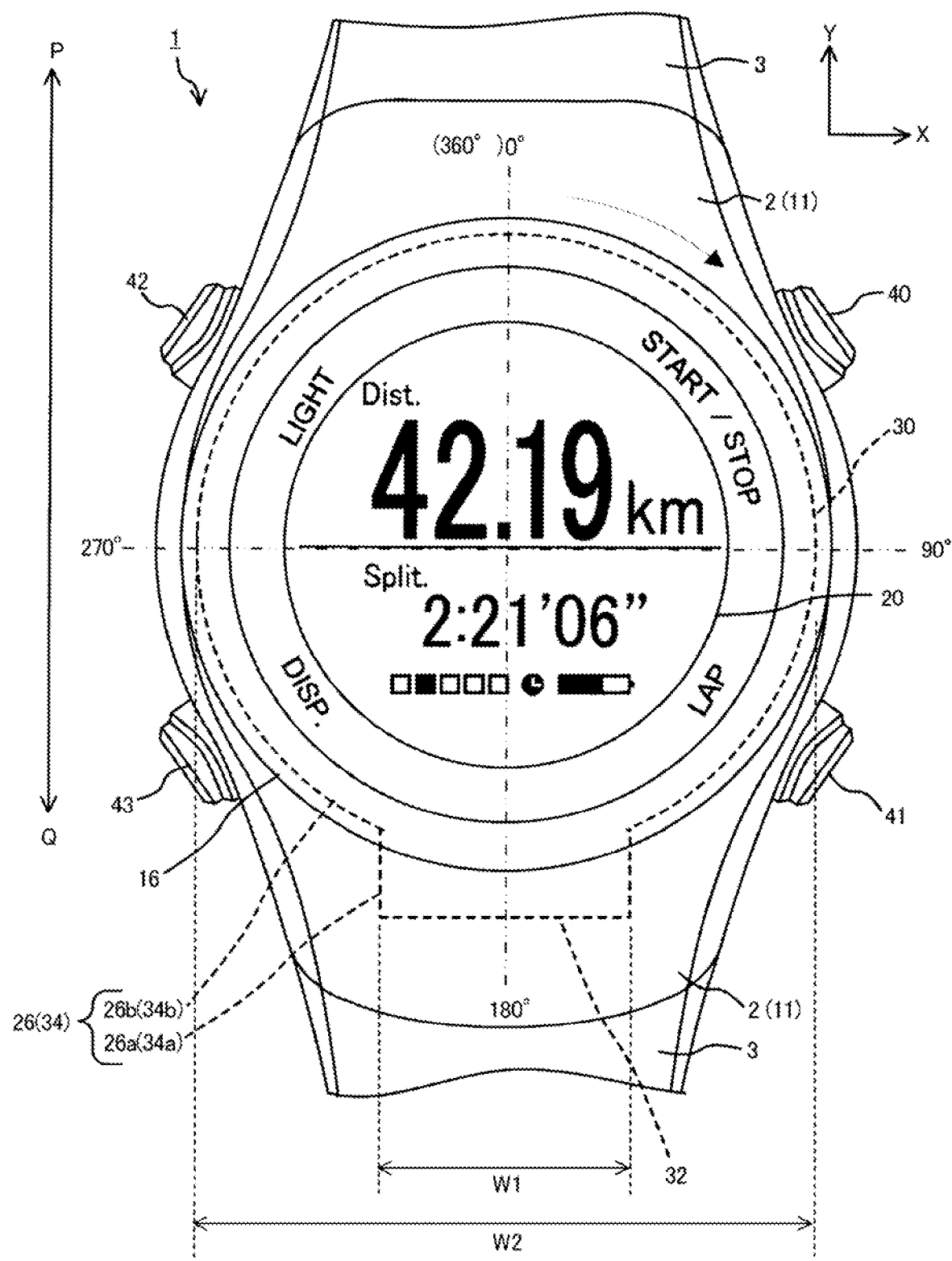
FIG. 2 is a plan view of an electronic device.

FIG. 2 is a plan view of the electronic device 1 shown in FIG. 1. As shown in FIG. 2, the electronic device 1 includes a case 2 and a band 3. The band 3 is formed to extend in the longitudinal direction to be capable of being wound on the wrist or the arm of the user. In FIG. 2, a part of the band 3 is omitted by drawing the part using wavy lines. Note that, in the electronic device 1, a side where the user visually recognizes time and measurement data is represented as a front surface side and a side worn on the wrist or the arm is represented as a rear surface side. In this embodiment, angles are defined as follows in a plan view of the case 2 viewed from a direction perpendicular to a display section 20 and from the side of the display section 20. When a direction along a line PQ parallel to the longitudinal direction of the band 3 shown in FIG. 2 is represented as an up-down direction, an upward direction of characters and numbers displayed on the display section 20 is represented as 0 degree. A clockwise direction is represented as plus and the circumference of the display section 20 is 360 degrees. In FIG. 2, the direction along the line PQ is represented as a Y-axis direction and a direction perpendicular to the Y-axis direction is an X-axis direction.

Figure 3:
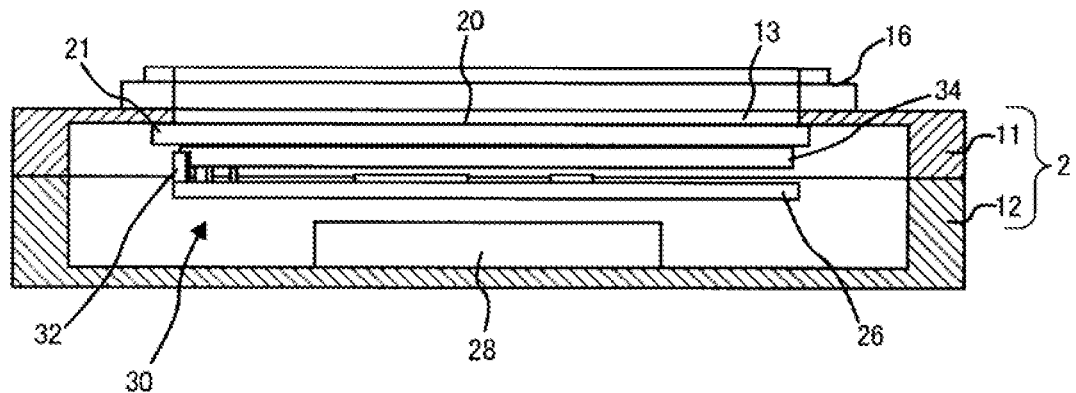
FIG. 3 is a partial sectional view of the electronic device.

FIG. 3 is a sectional view of the electronic device 1 taken along a plane passing the center of the display section 20 shown in FIG. 2 and parallel to an X axis. As shown in FIG. 3, the case 2 includes a case main body 11 and a rear cover 12. The case main body 11 is made of plastic such as polycarbonate resin and is formed in a substantially cylindrical shape. The rear cover 12 is attached to a rear surface side, which is an arm side on which the electronic device 1 is worn, in the case main body 11 and closes an opening on the rear surface side. The rear cover 12 may be made of plastic same as the case main body 11 or may be made of metal such as stainless steel.

As the case 2, a case of a one-piece type obtained by integrally forming the case main body 11 and the rear cover 12 may be used. When the case main body 11 and the rear cover 12 are integrated, a portion equivalent to the case main body 11 when separated is referred to as case main body and a portion equivalent to the rear cover 12 is referred to as rear cover.

Glass (windshield) 13, which is a light-transmitting member, is attached to an opening on the front surface side of the case main body 11. Note that the glass 13 may be formed of ITO (indium tin oxide) or the ITO may be patterned.

Note that the light-transmitting member is not limited to glass and may be plastic and only has to be a tabular member through which the user can visually recognize the further rear surface side (the display section 20) than the light-transmitting member from the front surface side of the light-transmitting member.

A bezel 16 functioning as an annular conductor is attached to the front surface side of the case main body 11. The bezel 16 is made of metal such as stainless steel, titanium, aluminum, copper, or silver and formed in an annular shape. A plated member can also be used as the bezel 16. Further, the bezel 16 may include ITO. The bezel 16 also has a function of reinforcing press-in and fixing of the glass 13 to the case main body 11.

In an internal space between the case main body 11 and the rear cover 12 (an internal space of the case 2), as shown in FIG. 3, the display section 20 and an antenna 30 are disposed in order from the glass 13 side (the front surface side) to the rear cover 12 side (the rear surface side). The antenna 30 includes an antenna electrode 34 functioning as a radiation plate (a first electrode plate) and a circuit board 26 functioning as a conductive plate (a second electrode plate). A detailed configuration of the antenna 30 is explained below.

The display section 20 includes a liquid crystal panel 21 attached with a backlight, which is an electronically controlled display device, and a panel frame (not shown in the figure) that holds the liquid crystal panel 21. The liquid crystal panel 21 is connected to the circuit board 26 via a flexible board. The panel frame is configured by a nonconductive member such as plastic.

The circuit board 26 is mounted with various ICs and that like that control display of the display section 20 and processes satellite signals received by the antenna 30. In this embodiment, the circuit board 26 is a second electrode plate of the antenna 30 and functions as a ground (GND) plate as well.

B: Circuit Configuration of the Antenna-Incorporated Electronic Device

Figure 4:
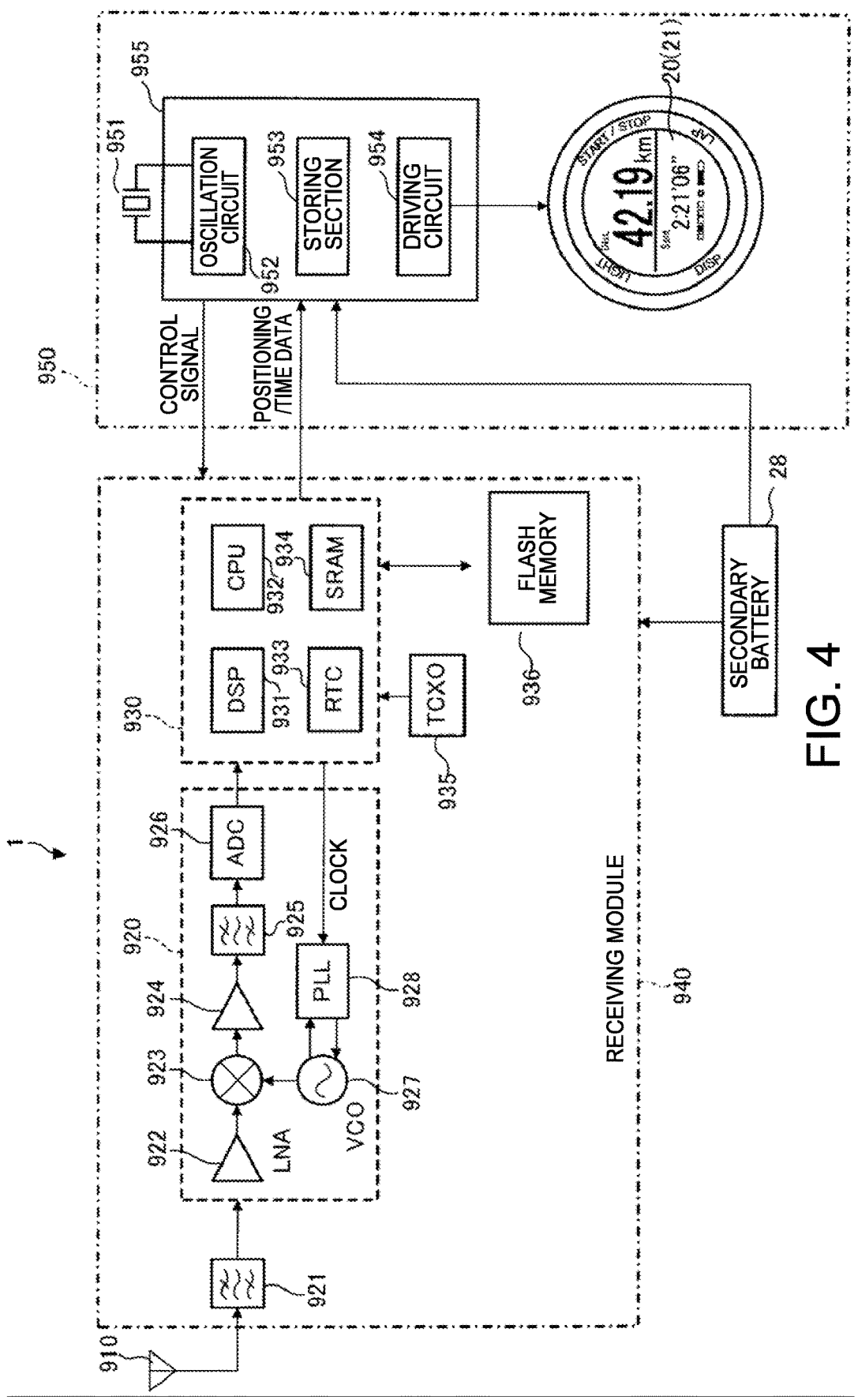
FIG. 4 is a block diagram showing a circuit configuration example of the electronic device.

A circuit configuration in the electronic device 1 in this embodiment is explained with reference to FIG. 4. The electronic device 1 in this embodiment is configured to receive positioning signals and the like by radio waves from GPS satellites 100 and use the positioning signals and the like.

The GPS satellites 100 shown in FIG. 1 are position information satellites that are orbiting on a predetermined track in the sky of the earth. The GPS satellites 100 are transmitting satellite signals, in which navigational messages and the like are superimposed on a microwave of, for example, 1.57542 GHz, to the ground. Atomic clocks are mounted on the GPS satellites 100. GPS time information, which is extremely accurate time information, clocked by the atomic clocks is included in the satellite signals. Therefore, the electronic device 1 including a function of the GPS receiver can display accurate time by receiving at least one satellite signal and correcting an advance or a delay of internal time. The correction is performed as a time measuring mode.

Track information and the like indicating positions on the track of the GPS satellites 100 are also included in the satellite signals. That is, the electronic device 1 can also perform positioning calculation. The electronic device 1 usually has, for example, a function of performing, by receiving satellite signals respectively transmitted from four or more GPS satellites 100, the positioning calculation using track information and GPS time information included in the satellite signals. According to the positioning calculation, the electronic device 1 can easily perform, for example, correction of a time difference according to the present position. The correction is performed as a positioning mode. The radio waves emitted by the GPS satellites 100 are right-hand circularly polarized waves. The radio waves minimize fluctuation in reception sensitivity due to the posture of a reception antenna and errors of time measurement and positioning due to the influence of a multi-path in, for example, a trough between buildings.

In addition to the above, if the satellite signals are used, various applications such as present position display, moving distance measurement, and moving speed measurement are possible. The electronic device 1 is capable of digitally displaying these kinds of information with the liquid crystal panel 21 of the display section 20. As shown in FIGS. 1 and 2, the electronic device 1 includes push buttons 40, 41, 42, and 43. The user operates the push buttons 40, 41, 42, and 43 to perform switching of information displayed on the liquid crystal panel 21 and other various kinds of control.

A circuit configuration of the electronic device 1, which is a running watch including a GPS receiving function is explained. FIG. 4 is a block diagram for explaining the electronic device 1 according to this embodiment. As shown in FIG. 4, the electronic device 1 includes an antenna section 910, a receiving module (a receiving section) 940, a display section 950 including a control section (a processing section) 955, and a secondary battery 28.

The antenna section 910 is connected to the receiving module 940. The antenna section 910 includes a SAW (Surface Acoustic Wave) filter 921, an RF (Radio Frequency) section 920, and a baseband section 930. The SAW filter 921 performs processing for extracting a satellite signal from a radio wave received by the antenna section 910. The RF section 920 includes an LNA (Low Noise Amplifier) 922, a mixer 923, and a VCO (Voltage Controlled Oscillator) 927. Further, the RF section 920 includes a PLL (Phase Locked Loop) control circuit 928, an IF (Intermediate Frequency) amplifier 924, an IF filter 925, and an ADC (A/D converter) 926.

The satellite signal extracted by the SAW filter 921 is amplified by the LNA 922, mixed with a local signal, which is output by the VCO 927, by the mixer 923, and down-converted into a signal in an intermediate frequency band. The PLL control circuit 928 and the VOC 927 form a phase-locked loop. A signal obtained by dividing the local signal output by the VCO 927 and a stable reference clock signal are subjected to phase comparison. The local signal and the reference clock signal are synchronized by feedback to achieve generation and stabilization of a local signal having an accurate frequency. A signal mixed by the mixer 923 is amplified by the IF amplifier 924. An unnecessary signal is removed by the IF filter 925. A signal passed through the IF filter 925 is converted into a digital signal by the ADC (A/D converter) 926.

The baseband section 930 includes a DSP (Digital Signal Processor) 931, a CPU (Central Processing Unit) 932, an SRAM (Static Random Access Memory) 934, and an RTC (Real Time Clock) 933. A temperature compensated crystal oscillator (TCXO) 935, a flash memory 936, and the like are connected to the baseband section 930.

The temperature compensated crystal oscillator (TCXO) 935 generates a reference clock signal having a substantially fixed frequency irrespective of temperature. Present position information, time difference information, and the like are stored in the flash memory 936. When the electronic device 1 is set in the time measuring mode or the positioning mode, the baseband section 930 performs processing for demodulating the baseband signal from the digital signal converted by the ADC 926 of the RF section 920. The baseband section 930 acquires satellite information such as track information and GPS time information included in a navigational message of a captured GPS satellite 100 and stores the satellite information in the SRAM 934.

The display section 950 includes the control section 955 and a quartz crystal resonator 951. The control section 955 includes a storing section 953, an oscillation circuit 952, and a driving circuit 954 and performs various kinds of control. The control section 955 controls the receiving module 940, sends a control signal to the receiving module 940, controls a receiving operation of the receiving module 940, and controls display of the liquid crystal panel 21 via the driving circuit 954 in the control section 955. Various kinds of information such as internal time information are stored in the storing section 953. The secondary battery 28 supplies energy necessary for operation of circuits and display.

The control section 955, the CPU 932, and the DSP 931 calculate measurement time and positioning information in cooperation with one another and derives information such as time, a present position, a moving distance, and moving speed on the basis of these kinds of information. The control section 955 performs control of display of these kinds of information on the liquid crystal panel 21 and performs control such as setting of an operation mode and a display mode of the electronic device 1 according to operation of the push buttons 40, 41, 42, and 43 shown in FIGS. 1 and 2. It is also possible to impart an advanced function such as navigation for displaying a present position on a map to the electronic device 1.

C: Structure of the Antenna

The structure of the antenna 30 in the electronic device 1 in this embodiment is explained with reference to FIGS. 5 to 19.

The antenna 30 in this embodiment is an antenna applied with a planar inverted F antenna or a plate inverted F antenna (PIFA). A general planar inverted F antenna has structure in which a conductor plate functioning as a second electrode plate and a radiation plate functioning as a first electrode plate are disposed to be opposed to each other, the conductor plate and the radiation plate are connected and short-circuited using a connecting section, and power is fed to the radiation plate by a power feeding element to obtain radio wave radiation.

Figure 5:
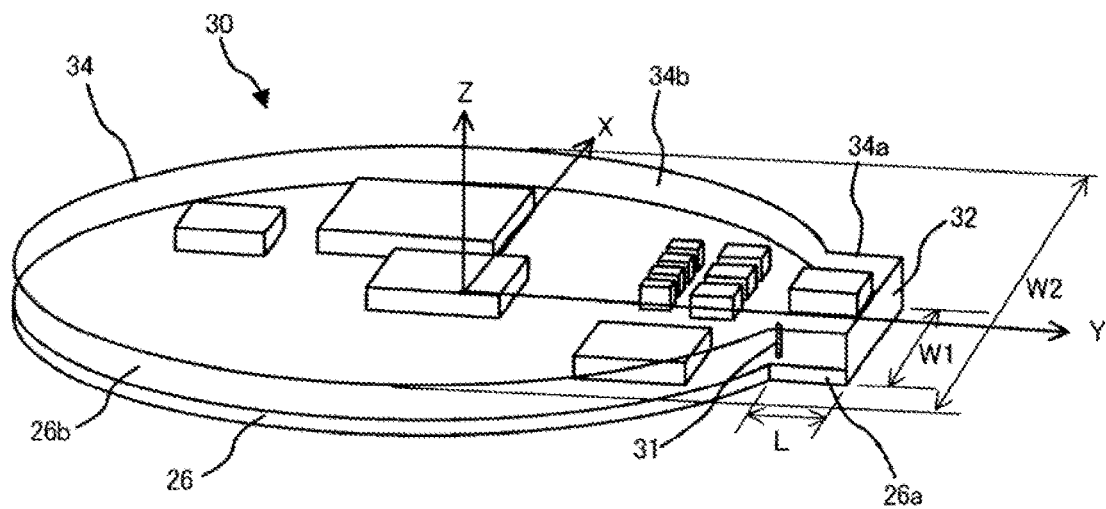
FIG. 5 is a perspective view of an example of an antenna functioning as an electronic component.
Figure 6:
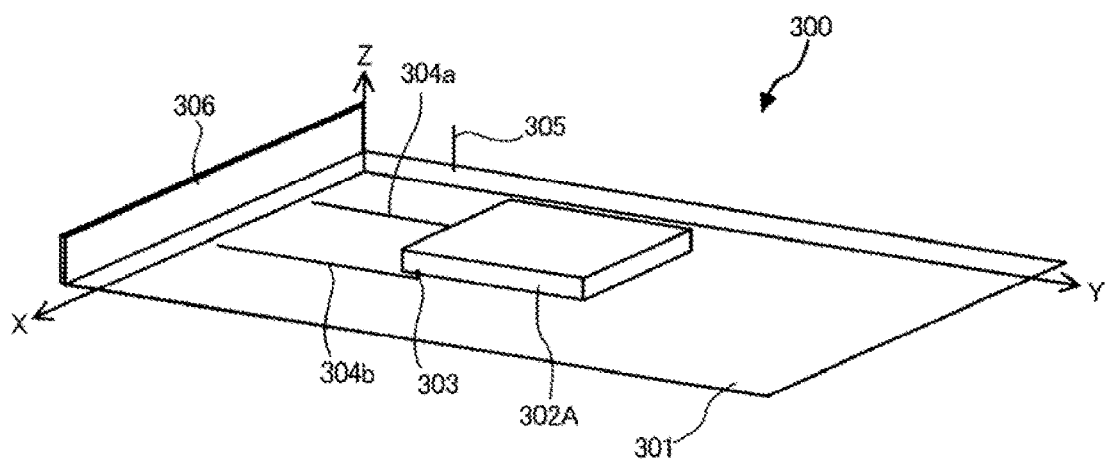
FIG. 6 is a schematic view showing a part of an example of a planar inverted F antenna.
Figure 7:
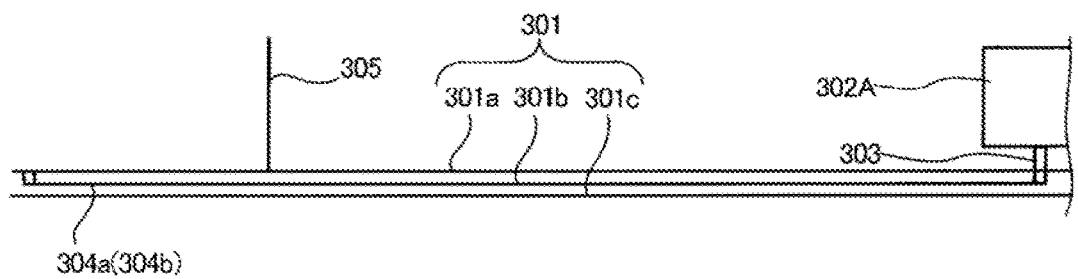
FIG. 7 is a partial sectional view of the planar inverted F antenna shown in FIG. 6.

FIGS. 5 to 7 are diagrams showing a basic structure of the antenna 30 in this embodiment. FIG. 5 is a perspective view of the antenna 30 used in the electronic device 1 shown in FIG. 2. FIG. 6 is a perspective view showing, in order to clearly show a result of a simulation, a planar inverted F antenna 300 including a rectangular first electrode plate and a rectangular second electrode plate. FIG. 7 is a sectional view of the planar inverted F antenna 300 taken along a plane parallel to a Y axis and a Z axis shown in FIG. 6 passing a wiring pattern 304b and a circuit component 302A.

In FIG. 5, a direction along a direction crossing a line segment connecting a position where a short-circuit section 32 is connected to the antenna electrode 34 functioning as the first electrode plate and a position where the short-circuit section 32 is connected to the circuit board 26 functioning as the second electrode plate is represented as an X-axis direction. In FIG. 5, a direction perpendicular to the surface of the antenna electrode 34 functioning as the first electrode plate or the surface of the circuit board 26 functioning as the second electrode plate and perpendicular to the X-axis direction is represented as a Z-axis direction. In FIG. 5, a direction perpendicular to the X-axis direction and the Z-axis direction is represented as the Y-axis direction. In the following explanation, in figures for explaining the planar inverted F antenna, a direction along a direction crossing a line segment connecting a position where the short-circuit section is connected to the first electrode plate and a position where the short-circuit section is connected to the second electrode plate is represented as the X-axis direction. A direction perpendicular to the surface of the first electrode plate or the surface of the second electrode plate and perpendicular to the X-axis direction is represented as the Z-axis direction. Further, a direction perpendicular to the X-axis direction and the Z-axis direction is represented as the Y-axis direction.

The antenna 30 used in the electronic device 1 shown in FIG. 2 needs to be disposed in the case 2 having a cylindrical inner wall. Therefore, as shown in FIG. 5, a planar inverted F antenna including the first electrode plate and the second electrode plate having a shape in which circular sections 26b and 34b and rectangular sections 26a and 34a are integrated is used. Note that it is also possible to dispose, in the case 2, the antenna 300 including the rectangular electrode plates shown in FIG. 6. However, as explained below, when one electrode plate is used as a circuit board, efficiency of use of a space in the case 2 is improved if the electrode plate is formed in a shape close to the shape of the inner wall of the case 2.

As shown in FIG. 5, in the antenna 30 in this embodiment, the circuit board 26 is used as the second electrode plate in the planar inverted F antenna. The antenna electrode 34 functioning as a shield of the liquid crystal panel 21 as well is used as the first electrode plate in the planar inverted F antenna. The circuit board 26 and the antenna electrode 34 are connected by the short-circuit section 32 functioning as the connecting section. A power feeding element 31 is connected to the antenna electrode 34. Signals received by the antenna electrode 34 and the circuit board 26 are supplied to circuits on the circuit board 26. Note that, in FIG. 5, to facilitate understanding, components on the circuit board 26 are drawn as if the components are seen through the antenna electrode 34.

In the circuit board 26, the rectangular section 26a, which is a connecting section of the circuit board 26 and the short-circuit section 32, and the circular section 26b are integrally formed. In the antenna electrode 34, the rectangular section 34a, which is a connecting section of the antenna electrode 34 and the short-circuit section 32, and the circular section 34b are integrally formed.

Width W1 of the short-circuit section 32 is smaller than a diameter W2, which is a maximum width, of the circular sections 26b and 34b. The antenna 30 is disposed in the case 2, for example, as indicated by a dotted line in FIG. 2. As shown in FIG. 2, when the diameter W2, which is the maximum width, of the circular sections 26b and 34b of the antenna 30 and the width W1 of the short-circuit section 32 equal to the width of the rectangular sections 26a and 34a are compared, the width W1 of the short-circuit section 32 is smaller than the diameter W2, which is the maximum width, of the circular sections 26b and 34b. As shown in FIG. 2, the shape of the antenna electrode 34 functioning as the first electrode plate in plan view and the shape of the display section 20 in plan view are substantially congruent. The antenna electrode 34 is disposed in a position close to the display section 20 and plays a function of a shield.

For example, when the diameter W2 of the circular sections 26b and 34b is set to 36 mm, the width W1 of the short-circuit section 32 is set to 15 mm. The width W1 of the short-circuit section 32 only has to be equal to or smaller than 15 mm and can be changed as appropriate. In this embodiment, the width W1 of the short-circuit section 32 is set smaller than the diameter W2 of the circular sections 26b and 34b of the circuit board 26 and the antenna electrode 34. Therefore, it is possible to extend a current path and reduce the size of a λ/4 antenna without using a dielectric. Note that the diameter W2 of the circular sections 26b and 34b can be changed as appropriate in a range of 20 mm to 50 mm.

The width W1 of the short-circuit section 32 needs to be smaller than both of maximum widths of the antenna electrode 34 and circuit board 26. For example, when the maximum width of one of the antenna electrode 34 and the circuit board 26 is equal to or smaller than the width W1 of the short-circuit section 32, the other of the antenna electrode 34 and the circuit board 26 (having the larger width) effectively functions as an antenna by only the maximum width of one of the antenna electrode 34 and the circuit board 26 (having the smaller width). As a result, a phenomenon in which the current path changes does not occur.

When the circuit board 26 is used as the second electrode plate in the planar inverted F antenna, a resonant frequency is greatly lower when circuit components are mounted on the circuit board 26 and wiring patterns are provided than when the circuit components are not mounted and the wiring patterns are not provided. In this embodiment, it is possible to reduce the antenna in size according to a wavelength reducing effect by the circuit components and the wiring patterns. The circuit components and the wiring patterns and the wavelength reducing effect are explained below.

The circuit board 26 in this embodiment is a three-layer board. GND patterns functioning as grounding sections are formed in a first layer on which the circuit components such as the IC are disposed and a third layer equivalent to a rear surface when the first layer is assumed as a front surface. A second layer sandwiched by the first layer and the third layer is used as a wiring layer. The wavelength reducing effect of the antenna 30 in this embodiment is explained using a modeled antenna.

A modeled antenna 300 is shown in FIG. 6. As shown in FIG. 6, in the antenna 300, the circuit component 302A assumed to be an IC as an example of a structure is mounted on a rectangular circuit board 301. Two terminals 303 among a large number of terminals of the circuit component 302A are connected to a plus power supply pattern of the circuit board 301 and a GND pattern functioning as a grounding section via wiring patterns 304a and 304b. The wiring pattern 304a connected to the plus power supply pattern is connected to the GND pattern via a large-capacity bypass capacitor (not shown in the figure).

A sectional view of FIG. 6 is shown in FIG. 7. FIG. 7 is a sectional view of the planar inverted F antenna 300 taken along the plane parallel to the Y axis and the Z axis shown in FIG. 6 passing the wiring pattern 304b and the circuit component 302A.

As shown in FIG. 7, the circuit board 301 is a three-layer board. GND patterns are formed on a first layer 301a and a third layer 301c. A second layer 301b is a wiring layer. The terminals 303 of the circuit component 302A are connected to the wiring patterns 304a and 304b formed on the second layer 301b. The wiring patterns 304a and 304b are connected to the GND pattern of the first layer 301a. A surface functioning as a first surface of the first layer 301a is opposed to an antenna electrode (not shown in the figure) functioning as the first electrode plate.

Figure 8:
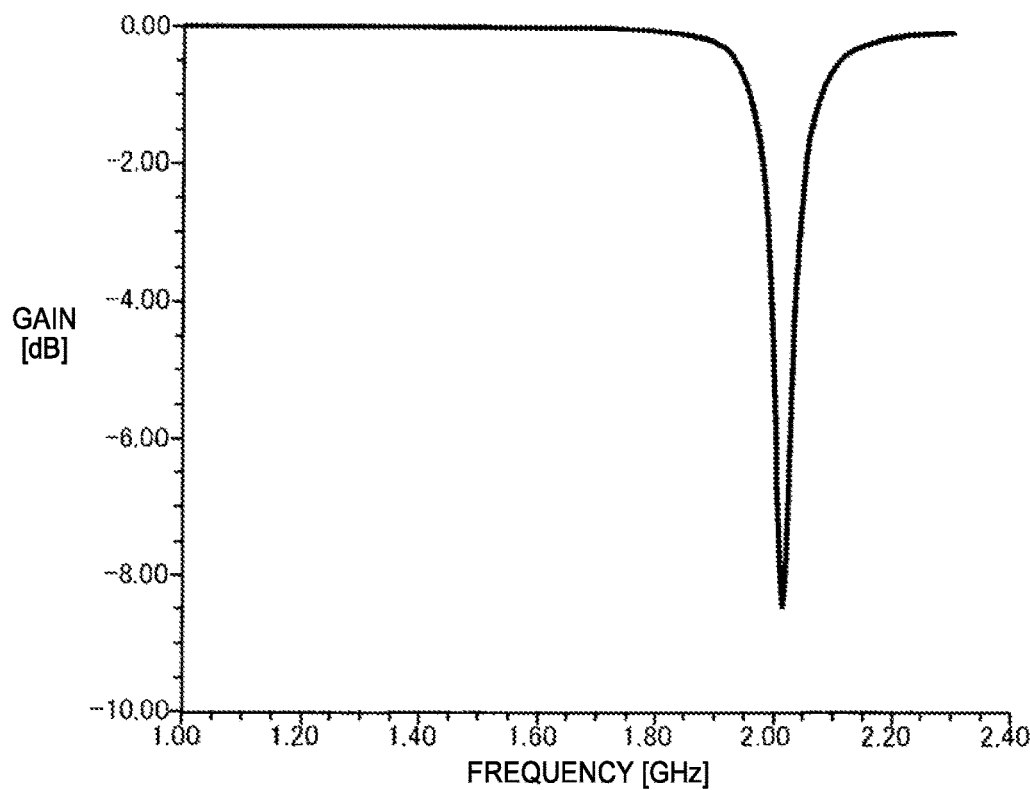
FIG. 8 is a graph showing an S parameter obtained when a circuit component and wiring patterns are removed from a state shown in FIG. 6.
Figure 9:
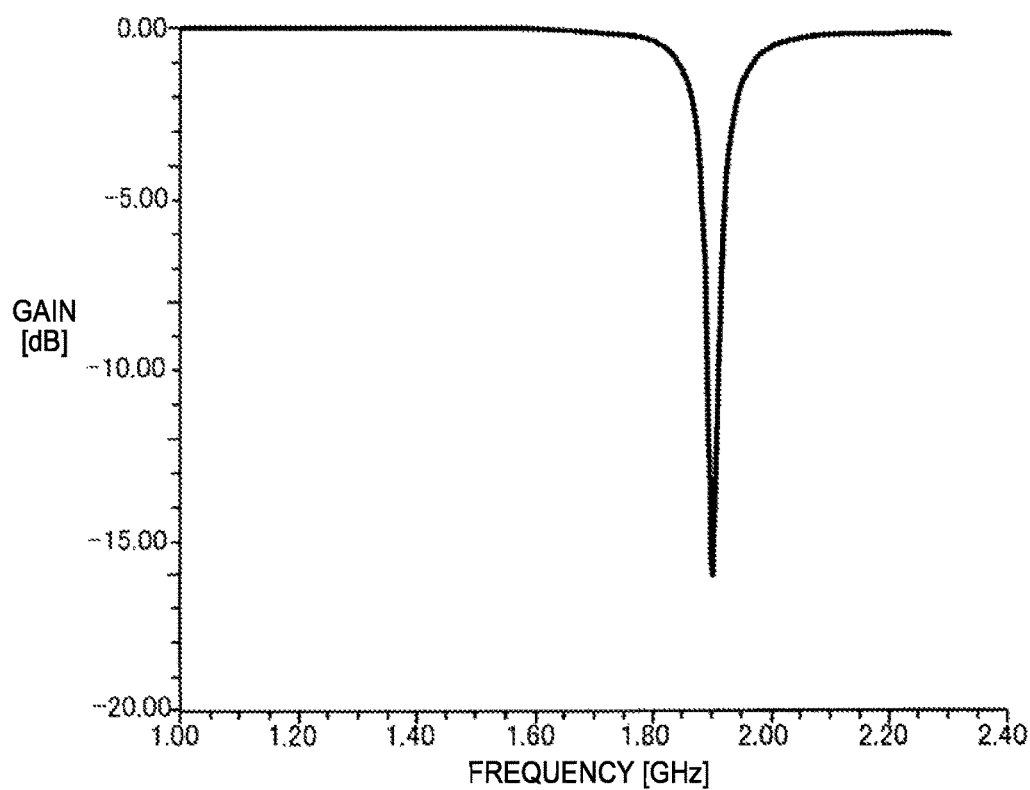
FIG. 9 is a graph showing an S parameter of the planar inverted F antenna shown in FIG. 6.

FIG. 8 is a graph showing an actual example of a frequency shift by an S parameter (Scattering parameter; a result of an electromagnetic field simulation) obtained when the circuit component 302A and the wiring patterns 304a and 304b of the second layer 301b are absent. FIG. 9 is a graph showing an actual example of a frequency shift by an S parameter obtained when the circuit component 302A and the wiring patterns 304a and 304b of the second layer 301b are provided on the circuit board 301.

Note that the S parameter (Scattering parameter) is one of circuit network parameters used to represent characteristics of a high-frequency electronic circuit and a high-frequency electronic component of an antenna or the like. The S parameter is called scattering matrix (S matrix) or scattering parameter as well. The S parameter represents passing/reflecting power characteristics of a circuit network.

As it is evident when the graph of FIG. 8 and the graph of FIG. 9 are compared, a resonant frequency is 2.02 GHz when the circuit component 302A and the wiring patterns 304a and 304b are absent. However, when the circuit component 302A and the wiring patterns 304a and 304b are provided, the resonant frequency fluctuates from 2.02 GHz to 1.90 GHz. It is seen that there is a frequency shift of 0.12 GHz.

Figure 10:
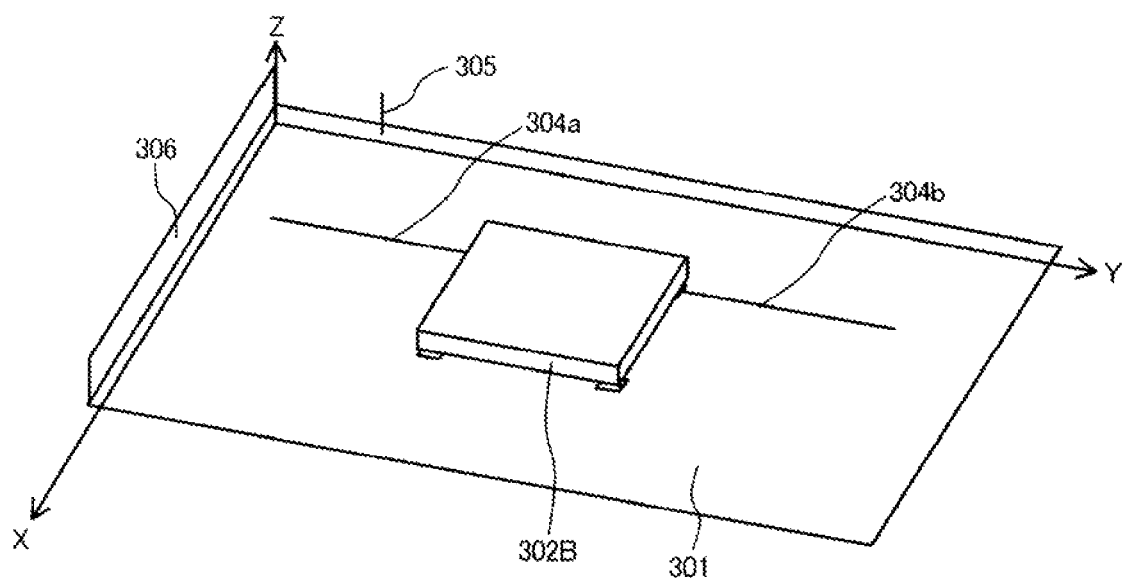
FIG. 10 is a schematic view showing a part of an example of a planar inverted F antenna in which the positions of the wiring patterns are changed.

A relation between the direction of a wire and a frequency shift is explained. In FIG. 10, concerning the antenna 300 shown in FIG. 6, an example is shown in which the positions of wires are changed. In the example shown in FIG. 10, the position of the wiring pattern 304a is the same as the position in the antenna 300 shown in FIG. 6. However, the wiring pattern 304b is provided in a position different from the position in the antenna 300 shown in FIG. 6. In a graph of FIG. 11, an S parameter (Scattering parameter; a result of an electromagnetic field simulation) of the antenna 300 shown in FIG. 10 is shown.

Figure 11:
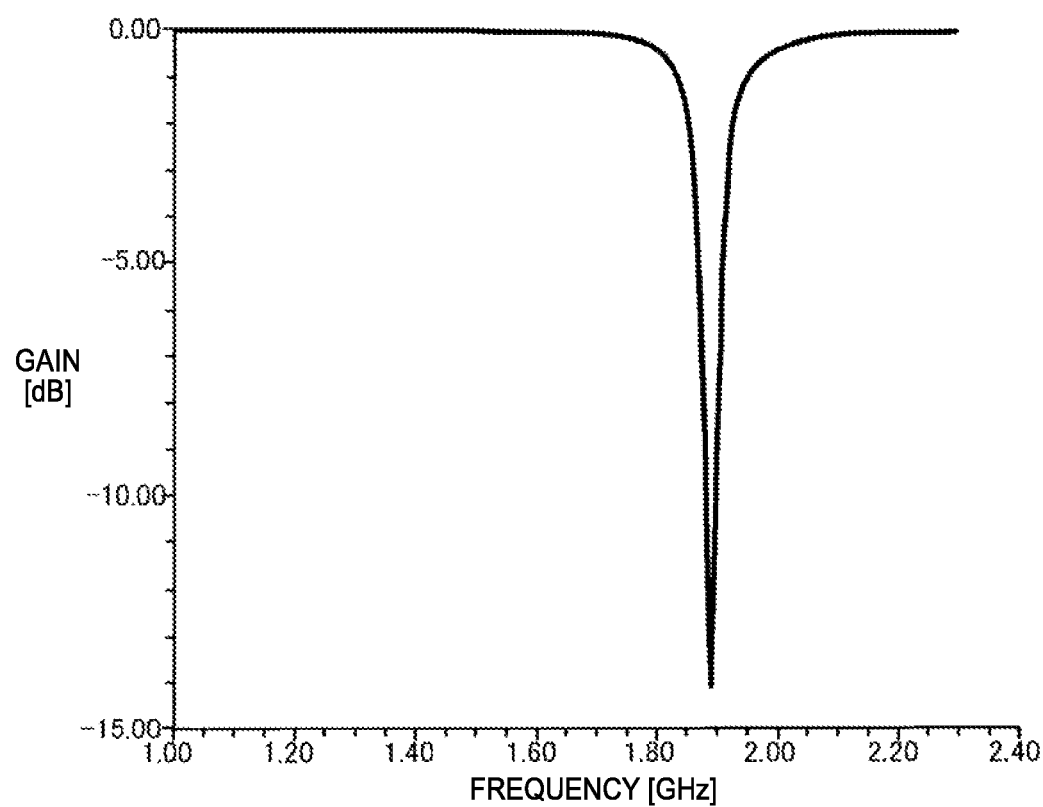
FIG. 11 is a graph showing an S parameter of the planar inverted F antenna shown in FIG. 10.

As it is evident when the graph of FIG. 9 and the graph of FIG. 11 are compared, a difference between the resonant frequencies is approximately 0.01 GHz. It is seen that the influence of the wiring pattern positions is small.

Figure 12:
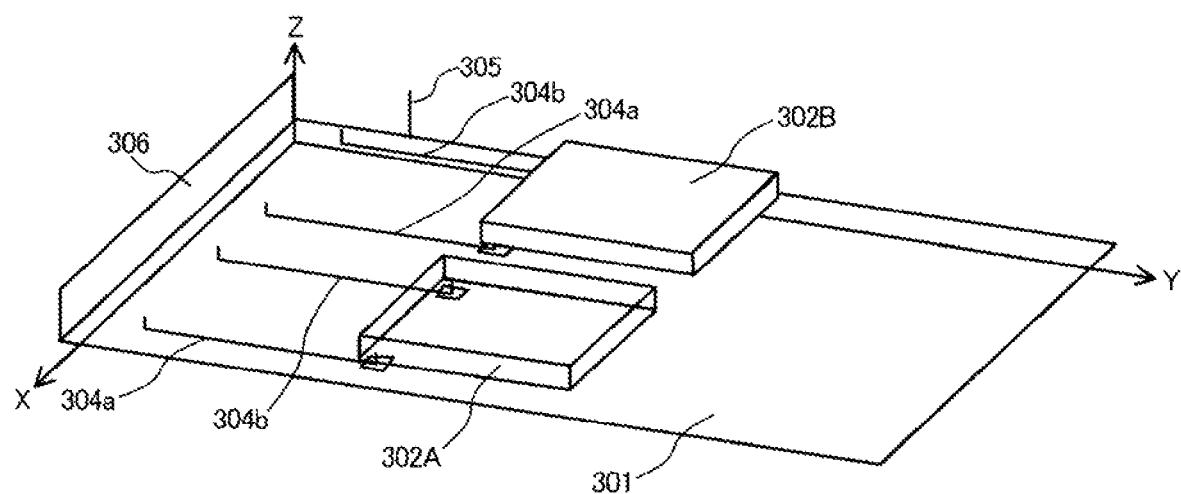
FIG. 12 is a schematic diagram showing a part of an example of a planar inverted F antenna in which circuit components and wiring patterns are added.

In FIG. 12, an example is shown in which the circuit component 302A shown in FIG. 6 and a circuit component 302B shown in FIG. 10 are disposed together and a plurality of circuit components are set on the circuit board 301. An example of a fluctuation amount of a resonant frequency in this case is shown in FIG. 13.

Figure 13:
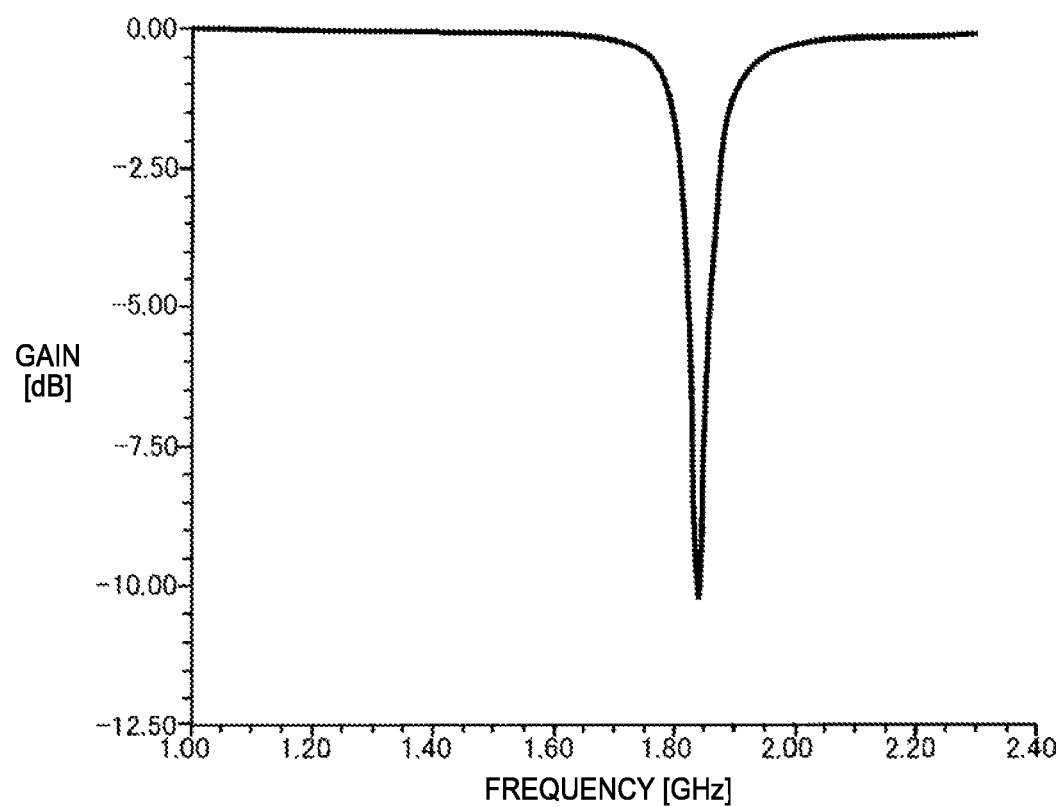
FIG. 13 is a graph showing an S parameter of the planar inverted F antenna shown in FIG. 12.

When a graph of FIG. 13 and the graph of FIG. 9 are compared, it is seen that the resonant frequency is 1.9 GHz when there are one set of components and the resonant frequency is 1.84 GHz when there are two sets of components. A shift amount from the example shown in FIG. 6 is 0.1 GHz in the case of one set and is 0.16 GHz in the case of two sets.

In resonant frequency measurement by an actual machine, a resonant frequency fluctuates substantially in proportion to the number of components. A tendency is considered to coincide with the simulation result explained above.

Figure 14:
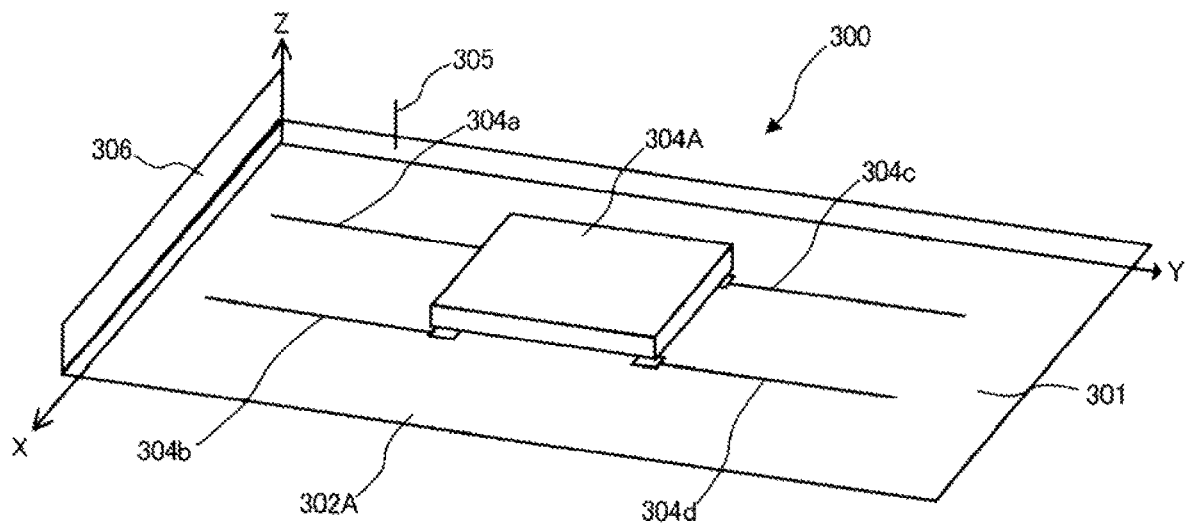
FIG. 14 is a schematic diagram showing a part of an example of a planar inverted F antenna in which wiring patterns are added.
Figure 15:
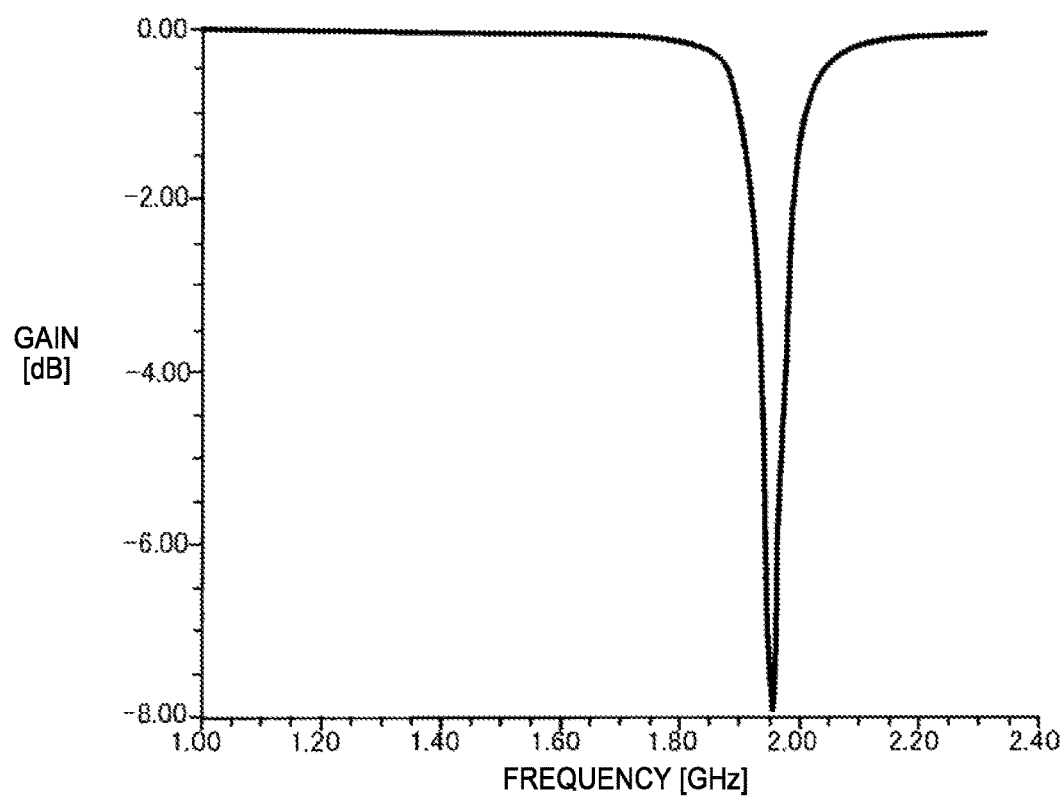
FIG. 15 is a graph showing an S parameter of the planar inverted F antenna shown in FIG. 14.

A disposition example of four wiring patterns is shown in FIG. 14. A frequency shift amount in this case is shown in FIG. 15. In the example shown in FIG. 14, wiring patterns 304c and 304d are added to the two wiring patterns 304a and 304b in the example shown in FIG. 6. Four wiring patterns are provided in total.

When the graph of FIG. 9 and a graph of FIG. 15 are compared, resonant frequencies are considered to be as explained below. When the two wiring patterns are provided as shown in FIG. 6, the resonant frequency is 1.90 GHz. When the four wiring patterns are provided as shown in FIG. 14, the resonant frequency is 1.95 GHz. A resonant frequency obtained when components and wiring patterns are absent is 2.00 GHz. Therefore, it is seen that, when the number of wiring patterns increases, parallel inductances increase and combined inductances decrease and a frequency shift also decreases.

Figure 16:
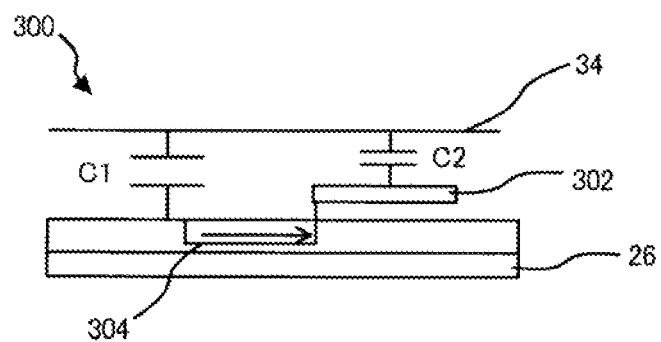
FIG. 16 is a diagram for explaining a current path in an example of the planar inverted F antenna.
Figure 17:
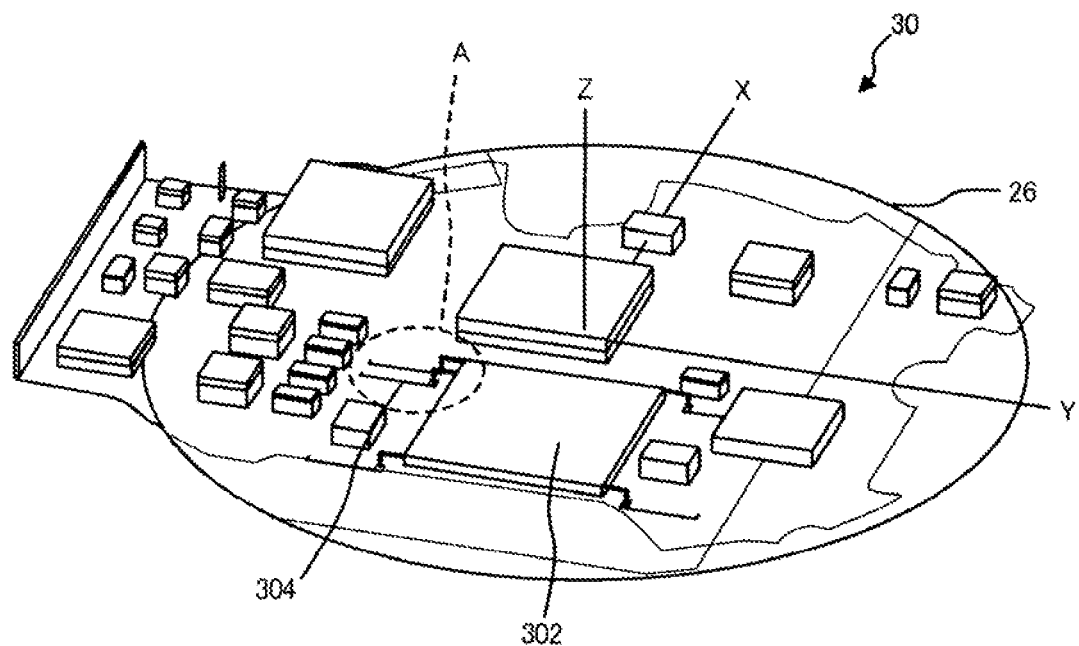
FIG. 17 is a perspective view showing a part of the example of the planar inverted F antenna.

A principle of wavelength reduction by the antenna 300 according to the invention explained above is explained. As shown in FIG. 16, according to the invention, a series resonant circuit of the inductance L, the parasitic capacitance C2, and the parasitic capacitance C1 is inserted. The inductance L is inductance generated by a wiring pattern 304 (304a and 304b) disposed in parallel to the antenna 300. The parasitic capacitance C2 is a parasitic capacitance configured by a circuit component 302 (302A and 302B) and the antenna electrode 34. The parasitic capacitance C1 is a parasitic capacitance configured by the circuit board 26 and the circuit component 302 (302A and 302B). Note that FIG. 16 corresponds to a cross section of a portion surrounded by a dotted line circle A in FIG. 17.

Since the interval between the circuit component 302 and the antenna electrode 34 is shorter than the interval between the antenna electrode 34 and the circuit board 26, as capacitance per unit area, the parasitic capacitance C2 is larger than the parasitic capacitance C1. As a result, a large electric current flows to the parasitic capacitance C2. In order to supplement the electric current, a large electric current flows to the wiring pattern 304, which connects the circuit component 302 and the GND pattern, as indicated by an arrow in FIG. 16. That is, a wavelength reducing effect is generated by the parasitic inductance L of the wiring pattern 304.

In this embodiment, a total resonant frequency is in the middle of a frequency peculiar to the antenna and the frequency of the LC series resonant circuit. The LC resonant circuit sometimes less easily contributes to power radiation of the antenna 300. It is possible to improve sensitivity by shifting an LC resonant frequency to a harmless frequency according to a method of, for example, increasing the width of the wiring pattern 304 forming the parasitic inductance L. Alternatively, it is possible to improve sensitivity by reducing the resistance R contributing to the inductance L.

In this embodiment, the length and the width of the wiring pattern 304, the width of the short-circuit section 32, or the electrode lengths of the antenna electrode 34 and the circuit board 26 are set such that a relation of the antenna resonant frequency=$1/\{2\times\pi\times(L\times C)^{1/2}\}$ is satisfied.

The capacitance C is capacitance obtained by combining equivalent capacitance of the electronic component and equivalent capacitance added by the structure. The inductance L is inductance obtained by combining equivalent inductance of the electronic component and equivalent inductance added by the structure.

As explained above, the antenna according to the invention uses a printed board as a parallel conductor plate of the antenna and feeds, with a component, an antenna resonant current to an inductance component caused by the wiring pattern. The antenna can reduce the resonant frequency of the antenna with a wavelength reducing effect by the antenna resonant current. That is, according to the invention, it is possible to obtain the wavelength reducing effect without using a dielectric block. It is possible to reduce the size of the antenna.

Further, according to the invention, in the planar inverted F antenna, it is possible to achieve a reduction in the size of a necessary antenna by only reducing the width of the short-circuit section. Therefore, when the resonant frequency is reduced more than necessary by the wavelength reducing effect of the component-mounted printed board, it is possible to improve the sensitivity of the antenna by adjusting the width of the short-circuit section.

Figure 18:
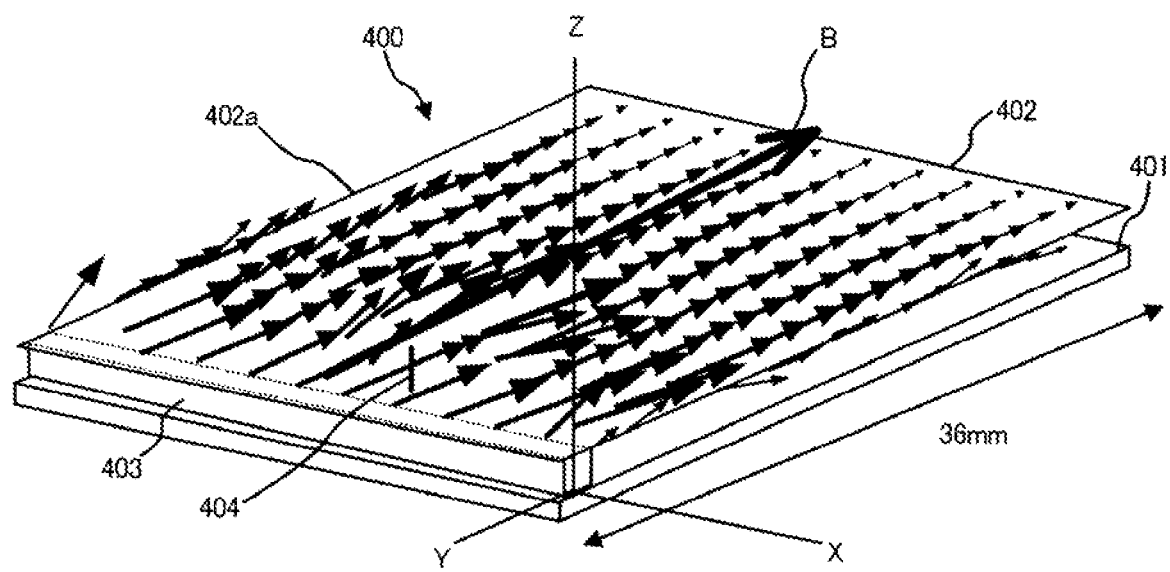
FIG. 18 is a schematic view showing a flow of an electric current in an antenna of a comparative example.
Figure 19:
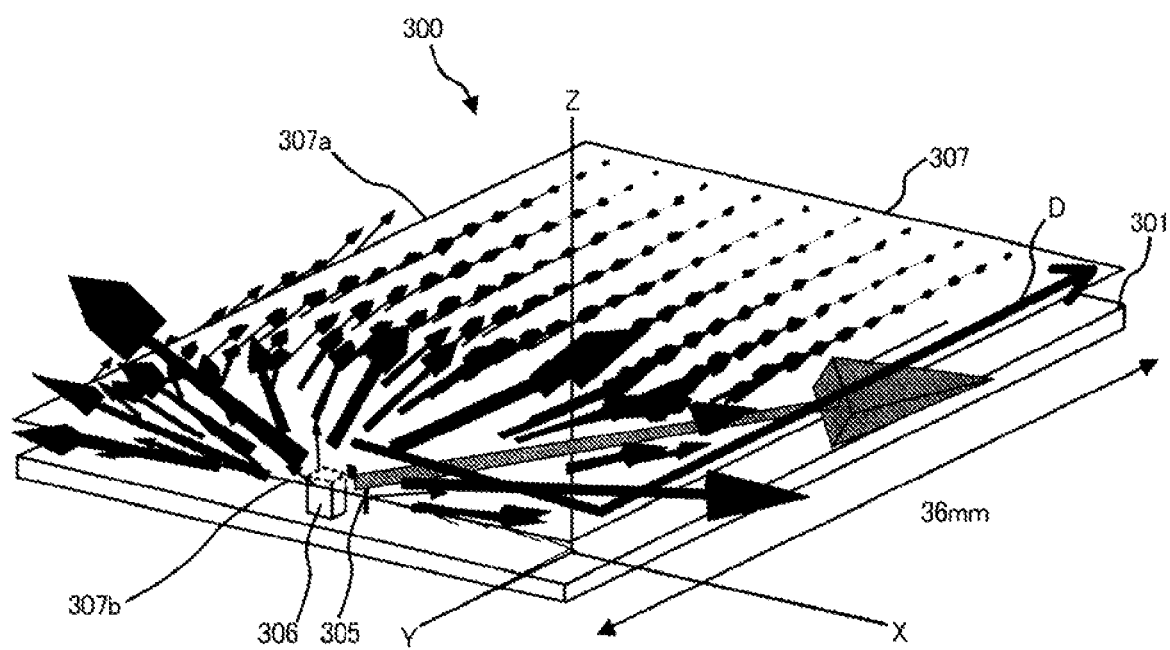
FIG. 19 is a schematic view showing a flow of an electric current in an antenna in the first embodiment.

FIG. 18 is a schematic diagram showing a flow of an electric current in a planar inverted F antenna 400 in a comparative example. FIG. 19 is a schematic diagram showing a flow of an electric current in the planar inverted F antenna 300 in this embodiment. In FIG. 18, an antenna electrode 402 functioning as the first electrode plate and a short-circuit section 403 are connected. In FIG. 19, an antenna electrode 307 functioning as the first electrode plate and a short-circuit section 306 are connected.

In FIGS. 18 and 19, arrows (excluding an arrow B and an arrow D) shown on the antenna electrodes indicate flows of electric currents calculated by simulations. The directions of the arrows indicate the directions of the electric currents. The sizes of the arrows indicate the magnitudes of the electric currents. The flow of the electric current in the planar inverted F antenna in the comparative example and the flow of the electric current in the planar inverted F antenna in this embodiment explained below with reference to FIGS. 18 and 19.

In the planar inverted F antenna 400 in the comparative example shown in FIG. 18, the antenna electrode 402 having size same as the size of a circuit board 401 is used and the circuit board 401 and the antenna electrode 402 are disposed to be superimposed such that positions in the X-axis direction and positions in the Y-axis direction of the circuit board 401 and the antenna electrode 402 viewed from the Z-axis direction coincide with each other. In the planar inverted F antenna 400 in the comparative example, the short-circuit section 403 having width equal to the width in the X-axis direction of the circuit board 401 and the width in the X-axis direction of the antenna electrode 402 is used. A power feeding element 404 is provided near the short-circuit section 403. In the planar inverted F antenna 400, as indicated by a large number of arrows, electric currents parallel to a side 402a extending in the Y-axis direction of the short-circuit section 403 flow. Therefore, as indicated by an arrow B, the length of a current path is the length of the side 402a. In the planar inverted F antenna 400 in the comparative example, it is assumed that, when λ represents a wavelength of a receives signal, the length of the current path is set to λ/4. In this case, for example, when the length of the side 402a is set to 36 mm, λ/4 is 36 mm. Therefore, the resonant frequency of the planar inverted F antenna 400 in the comparative example is 2.077 GHz.

In the planar inverted F antenna 300 in this embodiment shown in FIG. 19, the antenna electrode 307 functioning as the radiation plate having size same as the size of the circuit board 301 functioning as the conductor plate is used. The circuit board 301 functioning as the conductor plate and the antenna electrode 307 functioning as the radiation plate are disposed to be superimposed such that positions in the X-axis direction and positions in the Y-axis direction of the circuit board 301 and the antenna electrode 307 viewed from the Z-axis direction coincide with each other. However, the planar inverted F antenna 300 is different from the planar inverted F antenna 400 in the comparative example shown in FIG. 18 in that the width in the X-axis direction of the short-circuit section 306 is set smaller than the maximum width in the X-axis direction of the circuit board 301 functioning as the conductor plate and the maximum width in the X-axis direction of the antenna electrode 307 functioning as the radiation plate. In the planar inverted F antenna 300 in this embodiment, as in the planar inverted F antenna 400, a power feeding element 305 is provided near the short-circuit section 306. In the case of the planar inverted F antenna 300 in this embodiment, as indicated by a large number of arrows in FIG. 19, electric currents flows radially from the position of the short-circuit section 306. Therefore, a current path indicated by an arrow D extends, from the position of the short-circuit section 306, along a side 307b extending in the X-axis direction and changes to a path extending along a side 307a extending in the Y axis direction. The current path is longer than the current path of the planar inverted F antenna 400 in the comparative example. In the planar inverted F antenna 300 in this embodiment, it is assumed that the length of the current path is set to λ/4. In this case, when the length of the side 307a is set to 36 mm and the width of the side 307b is set to 28 mm, the length of the current path indicated by the arrow D is 50 mm. That is, since λ/4 is 50 mm, the resonant frequency of the planar inverted F antenna 300 in this embodiment is 1.514 GHz. As in the electronic device 1 in this embodiment, it is possible to use the planar inverted F antenna 300 as an antenna that receives positioning signals and the like by radio waves from the GPS satellites 100.

In this embodiment, it is possible to reduce a frequency by reducing the width of the short-circuit section to thereby extend the current path as explained above and feeding, with the circuit components, the antenna resonant current to the inductance component generated by the wiring patterns explained above. As a measurement example of an actual machine, compared with when the board of the antenna 300 shown in FIG. 6 is configured by a uniform metal plate, an effect of reducing the frequency from 1.5 GHz to 1.1 GHz is observed.

As an antenna that receives a radio wave (1.57542 GHz) of a GPS, an antenna having a diameter of 35 mm has been necessary. However, in the case of the invention, it is possible to reduce the diameter to 25 mm.

Further, according to an electromagnetic field simulation performed using the antenna 300 in FIG. 6, it has been found that radiation efficiency can be improved from 20% to 35% by enlarging a wiring pattern, which is set to default width of 0.1 mm, to 0.5 mm.

Second Embodiment

In the first embodiment, the waveform reducing effect is generated by reducing the width of the short-circuit section to thereby increase the length of the current path and feeding, with the circuit components, the antenna resonant frequency to the inductance component generated by the wiring pattern.

However, when waveform reducing effect is too large, the waveform reducing effect may be suppressed to obtain a desired resonant frequency by adjusting the width of the short-circuit section, the length or the width of the wiring pattern, and the like.

The waveform reducing effect may be suppressed to obtain a desired resonant frequency by connecting a capacitor having the capacitance C to the wiring patterns anew such that the relation of the antenna resonant frequency=1/$\{2\times\pi\times(L\times C)^{1/2}\}$ is satisfied with respect to the inductance L of the wiring patterns.

Further, a new capacitor for adjustment of the resonant frequency may be connected in parallel to a capacitor provided for another purpose rather than the adjustment of the resonant frequency. It is possible to cause the new capacitor for the adjustment of the resonant frequency and the inductance L of the wiring pattern to perform series resonance. It is possible to obtain a desired resonant frequency.

The widths of a wiring pattern that directly connects the circuit component 302 and the GND pattern and a wiring pattern that connects the circuit component 302 and the GND pattern via a capacitor may be set to be larger than the width of wiring patterns connected to components and the like other than the circuit component 302. A desired resonant frequency may be obtained by suppressing the wavelength reducing effect in this way.

Modifications

The invention is not limited to the embodiments explained above. For example, various modifications explained below are possible. One or a plurality of forms optionally selected out of forms of the modifications explained below can be combined as appropriate.

Modification 1

Figure 20:
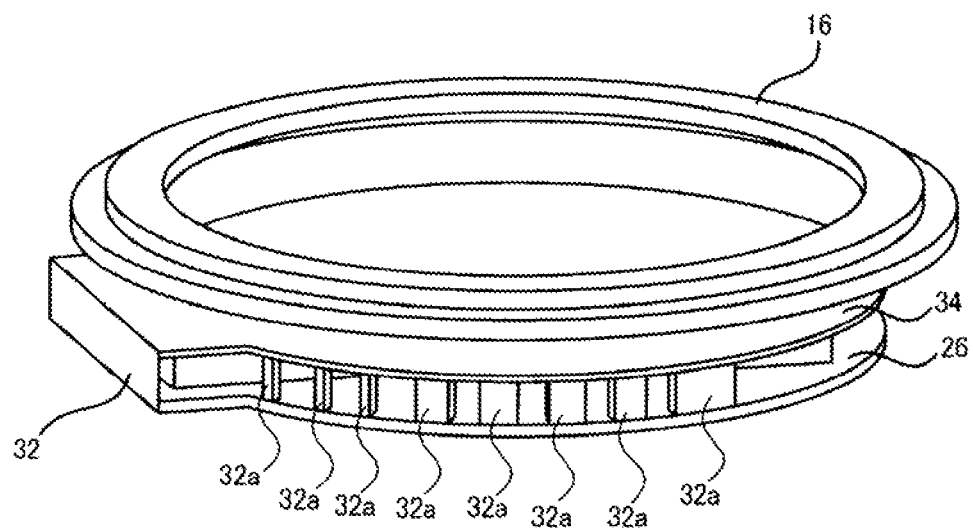
FIG. 20 is a perspective view showing a short-circuit section for frequency adjustment.

As shown in FIG. 20, the adjustment of the frequency may be performed by attaching, between the antenna electrode 34 and the circuit board 26, frequency adjustment bars 32*a* functioning as short-circuit sections for adjustment separately from the short-circuit section 32. In this case, the adjustment of the frequency can be performed by changing the number and attachment positions of the frequency adjustment bars 32*a*. This is because an effect equivalent to the change of the width of the short-circuit section 32 can be obtained by providing the frequency adjustment bars 32*a*. When the frequency is adjusted, a resonant frequency at the time when the number and the attachment positions of the frequency adjustment bars 32*a* are changed only has to be calculated by a simulation.

Modification 2

Figure 21:
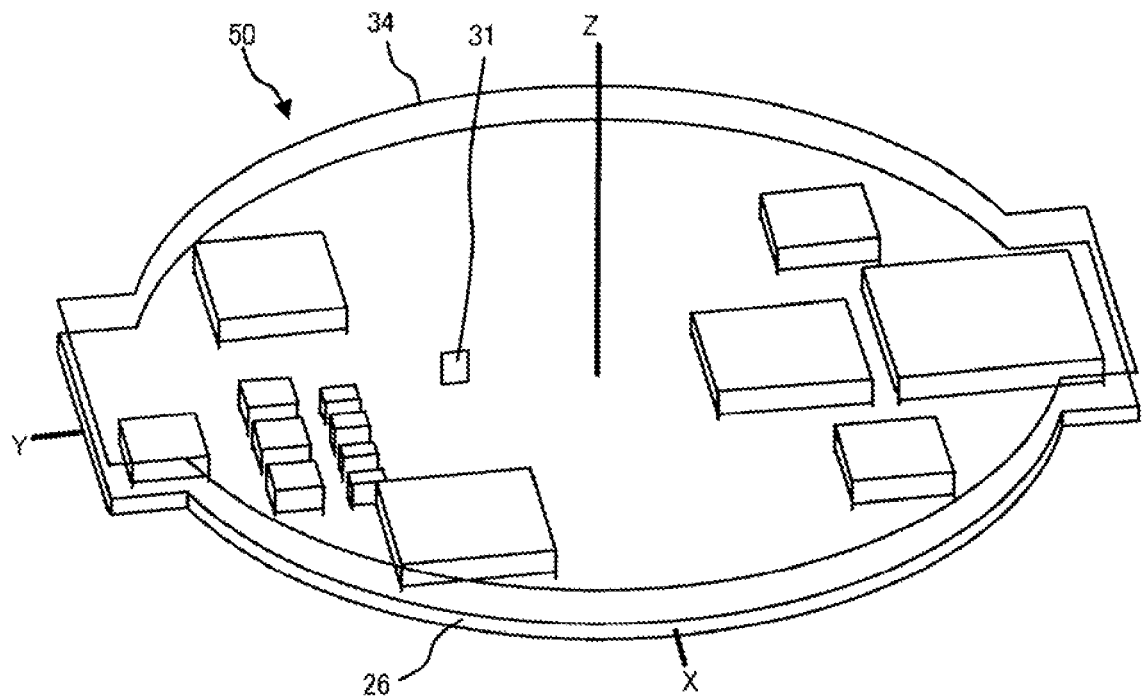
FIG. 21 is a perspective view showing an example of a patch antenna.

An example in which the invention is applied to a patch antenna is shown in FIG. 21. When a patch antenna 50 shown in FIG. 21 is compared with the antenna 30 shown in FIG. 5, the short-circuit section 32 is absent and a power feeding position of the power feeding element 31 is the substantial center of the circuit board 26. The "substantial center" refers to a position closer to the center of the circular section of the circuit board 26 than the short-circuit section 32. Even in such the patch antenna 50, the lengths and the widths of the wiring pattern that directly connects the circuit component 302 and the GND pattern and the wiring pattern that connects the circuit component 302 and the GND pattern via the capacitor and the electrode lengths of the antenna electrode 34 and the circuit board 26 may be set. By setting the lengths and the widths and the electrode lengths in this way, it is possible to adjust the size of wavelength reduction and obtain a desired resonant frequency.

Modification 3

In the embodiments explained above, a ceramic multilayer board is used as an example of the circuit board. However, an LDS board formed by LDS (Laser Direct Structuring) may be used. A board on which electric conductors and insulators are stacked can be used as the circuit board. When the planar inverted F antenna is configured using the multilayer board, the short-circuit board 32 only has to be connected to at least one layer among the electric conductors of the multilayer board.

In the embodiments explained above, an integrated circuit is used as an example of the circuit component. However, the invention is not limited to such a configuration. As the circuit component, a stud, a conductor block, a shield case, or the like may be used.

Modification 4

A hole section may be provided in the GND pattern formed on the circuit board 26. In this case, since an electric current bypasses the hole section, the current path is extended and the wavelength reducing effect can be obtained.

The hole section only has to be formed in at least one layer on a side close to the first electrode plate of the multilayer board to draw a wire connected to the circuit component functioning as the structure into a multilayer board inner layer through the hole section. The wire formed in the inner layer is connected to, directly or through resistance, inductance, capacitance or the like, the layer to which the short-circuit section is connected. With this configuration, the radiation efficiency is less easily deteriorated and the wavelength reducing effect can be obtained.

Like the planar inverted F antenna and the patch antenna, in an antenna having an operation principle for generating an electric field between parallel two conductor plates and causing the conductor plates to operate as an antenna, higher radiation efficiency tends to be obtained as the area of the conductor plates is larger. When wires are disposed on the surface (the first surface) of the circuit board as the conductor plates, the area of the circuit board decreases. However, by disposing the wires on another layer, it is possible to suppress the area decrease of the circuit board and reduce the resonant frequency. As a result, it is possible to obtain higher radiation efficiency with an antenna having a smaller area.

Modification 5

In the embodiments and the modifications explained above, the GPS radio wave having the frequency of 1.5 GHz is received by the antenna according to the invention. However, the invention is not limited to this configuration. The antenna according to the invention is suitable for receiving, for example, radio waves having frequencies of 100 MHz to 30 GHz.

When the invention is applied to an electronic device having the size of a wristwatch, a frequency near 1.5 GHz of the GPS or 2.4 GHz of the wireless LAN is optimum. When the invention is applied to an electronic device having the size of a cellular phone, a frequency of 700 MHz or 900 MHz used by the cellular phone is optimum.

Examples of usable signals of a positioning satellite include signals of the GLONASS (GLObal NAvigation Satellite System), the GALILEO, the BeiDou (BeiDou Navigation Satellite System), the WAAS (Wide Area Augmentation System), and the QZSS (Quasi Zenith Satellite System) besides the GPS.

The antenna may receive radio waves adapted to the standard such as the Bluetooth (registered trademark) or the Wi-Fi (registered trademark).

Modification 6

In the embodiments and the modifications explained above, the equivalent electric lengths of a first ribbon functioning as a first radiating element and a second ribbon functioning as a second radiating element are respectively ¼ wavelengths. However, the invention is not limited to this configuration. For example, the equivalent electric lengths only have to be integer multiples of the ¼ wavelength.

Modification 7

In the embodiments and the modifications explained above, the running watch and the GPS watch are described as the examples of the electronic device according to the invention. However, the invention is not limited to these electronic devices. The invention is applicable to various electronic devices that receive radio waves with antennas and display information. The invention is applicable to, for example, electronic devices (electronic terminals) such as a heart rate meter of a wristwatch type, a GPS device of an earphone type, and a smartphone and wearable electronic devices such as a head mounted display.

What is claimed is:

1. An electronic component comprising:
  a first electrode plate being an antenna electrode;
  a second electrode plate including a first surface facing the first electrode plate, a grounding section, a circuit component disposed on the first surface to obtain a wavelength reducing effect, and a wire configured to connect the circuit component and the grounding section; and
  a connecting section configured to electrically connect the first electrode plate and the second electrode plate.

2. An electronic component comprising:
  a first electrode plate being an antenna electrode;
  a second electrode plate; and
  a power feeding portion provided on the second electrode plate,
  wherein the second electrode plate includes:
    a first surface facing the first electrode plate;

a grounding section;
a circuit component disposed on the first surface to obtain a wavelength reducing effect; and
a wire configured to connect the circuit component and the grounding section.

3. The electronic component according to claim 1, wherein the second electrode plate is a circuit board.

4. The electronic component according to claim 2, wherein the second electrode plate is a circuit board.

5. The electronic component according to claim 3, wherein the circuit board is a board on which an electric conductor and an insulator are stacked.

6. The electronic component according to claim 4, wherein the circuit board is a board on which an electric conductor and an insulator are stacked.

7. The electronic component according to claim 1, wherein the circuit component is at least any one of an integrated circuit, a stud, a conductor block, and a shield case.

8. The electronic component according to claim 2, wherein the circuit component is at least any one of an integrated circuit, a stud, a conductor block, and a shield case.

9. The electronic component according to claim 1, wherein the connecting section short-circuits the first electrode plate and the second electrode plate.

10. The electronic component according to claim 2, wherein the connecting section short-circuits the first electrode plate and the second electrode plate.

11. The electronic component according to claim 1, wherein a resonant frequency of the electronic component satisfies a following expression:

the resonant frequency=$1/\{2\times\pi\times(L\times C)^{1/2}$.

where,

C represents capacitance obtained by combining equivalent capacitance of the electronic component and equivalent capacitance added by the circuit component, and L represents inductance obtained by combining equivalent inductance of the electronic component and equivalent inductance added by the circuit component.

12. The electronic component according to claim 2, wherein a resonant frequency of the electronic component satisfies a following expression:

the resonant frequency=$1/\{2\times\pi\times(L\times C)^{1/2}$.

where,

C represents capacitance obtained by combining equivalent capacitance of the electronic component and equivalent capacitance added by the circuit component, and L represents inductance obtained by combining equivalent inductance of the electronic component and equivalent inductance added by the circuit component.

13. The electronic component according to claim 11, wherein width of the wire that connects the circuit component and the grounding section directly or via a capacitor is larger than width of other wires connected to components other than the circuit component.

14. The electronic component according to claim 12, wherein width of the wire that connects the circuit component and the grounding section directly or via a capacitor is larger than width of other wires connected to components other than the circuit component.

15. An electronic device comprising the electronic component according to claim 1.

16. An electronic device comprising the electronic component according to claim 2.

* * * * *